(12) United States Patent
Kobayashi

(10) Patent No.: US 8,709,947 B2
(45) Date of Patent: Apr. 29, 2014

(54) METHOD FOR FORMING PATTERN

(71) Applicant: Yuji Kobayashi, Mie (JP)

(72) Inventor: Yuji Kobayashi, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/707,799

(22) Filed: Dec. 7, 2012

(65) Prior Publication Data

US 2014/0065822 A1 Mar. 6, 2014

Related U.S. Application Data

(60) Provisional application No. 61/694,602, filed on Aug. 29, 2012.

(51) Int. Cl.
*H01L 21/44* (2006.01)

(52) U.S. Cl.
USPC ........... 438/671; 438/622; 438/696; 438/703; 257/E21.214

(58) Field of Classification Search
USPC ................. 438/622–626, 671, 696, 703, 717; 257/E21.214
See application file for complete search history.

(56) References Cited

U.S. PATENT DOCUMENTS

| | | | |
|---|---|---|---|
| 8,048,762 B2 | 11/2011 | Ohuchi | |
| 8,158,332 B2 | 4/2012 | Matsunaga et al. | |
| 8,389,400 B2 * | 3/2013 | Lee et al. | 438/622 |
| 2010/0130019 A1 | 5/2010 | Ohuchi | |
| 2010/0183982 A1 | 7/2010 | Matsunaga et al. | |
| 2011/0318931 A1 * | 12/2011 | Min et al. | 438/696 |

FOREIGN PATENT DOCUMENTS

| | | |
|---|---|---|
| JP | 2009-10156 | 1/2009 |
| JP | 2010-80942 | 4/2010 |
| JP | 2010-171039 | 8/2010 |

* cited by examiner

*Primary Examiner* — Alexander Ghyka
*Assistant Examiner* — Syed Gheyas
(74) *Attorney, Agent, or Firm* — Oblon, Spivak, McClelland, Maier & Neustadt, L.L.P.

(57) ABSTRACT

A method for forming a pattern according to an embodiment, includes forming a first film pattern having a wide width dimension above a processed film; forming a second film pattern covering a portion of the first film pattern and a third film pattern connected to the second film pattern together above the processed film, the third film pattern having a width dimension narrower than the first film pattern, and to be a line pattern of a line and space pattern; forming a fourth film pattern on a side face of the first film pattern and a plurality of film patterns by the fourth film to be a line pattern of a line and space pattern on both side faces of the third film pattern; and removing the second film pattern and the third film pattern.

20 Claims, 15 Drawing Sheets

Hook-Up Region ↑↓ Wiring Region

Hook-Up Region ↕ Wiring Region

Hook-Up Region

Wiring Region

Hook-Up Region / Wiring Region

METHOD FOR FORMING PATTERN

CROSS-REFERENCE TO RELATED APPLICATION

This application is based upon and claims the benefit of priority from U.S. Patent Application No. 61/694,602 filed on Aug. 29, 2012 in U.S.A., the entire contents of which are incorporated herein by reference.

FIELD

Embodiments described herein relate generally to a method for forming a pattern.

BACKGROUND

In fine patterning of semiconductor devices, fine patterning relying on only optical lithography technology whose limit is being reached is moving to a new stage thanks to double patterning technology based on conventional optical lithography technology. Various kinds of double patterning technology have been developed/published and the currently mainstream technology includes a sidewall process.

The sidewall process is a process in which a line & space (L/S) pattern with a double pitch is formed by optical lithography technology and the pattern is slimmed and used as a core material to form a sidewall film on the sidewall thereof. Then, the core material is removed and a desired pitch pattern is formed by etching a desired processed film using the remaining sidewall film or a foundation film processed based on the sidewall film as a hard mask. Though the above sidewall process has a long process flow and is complicated when compared with a normal single exposure process, a pattern by lithography only needs to be formed with double the desired pitch and added processes for slimming and sidewall formation are diverted from conventional technology and therefore, finer patterning can advantageously be developed easily while curbing investment.

A major feature of pattern formation by the sidewall process is that the line width is controlled by controlling the thickness of a sidewall film. In a process of forming a pattern of only a simple line & pattern, the pattern can be formed by controlling the width of a core material and the thickness of a sidewall film. However, wiring layers in upper and lower layers are connected to a wiring pattern in an actual semiconductor device via a hole pattern to configure a semiconductor circuit and thus, it is necessary to arrange a wide wiring pattern in places in a pattern layout. Because, as described above, the wire width that can be formed by the sidewall process is determined by the thickness of a sidewall film, such a wide pattern is normally added separately after undergoing the sidewall process.

However, problems that are not considered when various pattern variations are formed by conventional optical lithography are caused by adding the wide pattern. For example, a case when a wide pattern is exposed and developed after being aligned with a sidewall pattern using optical lithography and then, a lower-layer film is etched by using a film pattern configured by the wide pattern and the sidewall pattern as a mask can be considered. However, according to such a technique, it is necessary to expose a sidewall pattern portion by developing the wide pattern. For a positive resist, for example, the resist buried in the sidewall pattern portion needs to be removed by sensitizing for development. However, the sidewall pattern is formed in fine dimensions less than the resolution limit of exposure and thus, exposure light does not reach a resist near the lower portion of the sidewall pattern and the resist cannot be removed by development and thus, a resist residue arises. As a result, the resist residue is transferred also in the subsequent transfer of the sidewall pattern to a lower-layer film, posing a problem of a short of the sidewall pattern.

If a negative resist is used instead of a positive resist, there is no need to shine light on the sidewall pattern portion and the sidewall pattern portion can be exposed only by adjusting the developing time, but in this case, a problem of a collapsing sidewall pattern due to surface tension of water is caused in a rinsing/drying process after the development.

It is possible here to consider coexistence of a sidewall pattern and a wide pattern by forming a coating-type organic film on a wafer after the sidewall pattern being formed for planarization of steps by the sidewall pattern and then performing an optical lithography process of the wide pattern and etching the coating-type organic film using a resist as a mask. According to such a technique, however, a problem like the collapse of sidewall patterns by random air gaps generated by poor embedding between sidewall patterns when the coating-type organic film is coated arises. Also, a problem of difficulty of ensuring the needed thickness (height) of the sidewall pattern to process a lower-layer film when the coating-type organic film is etched arises.

DETAILED DESCRIPTION

First Embodiment

A method for forming a pattern according to an embodiment, includes forming a processed film above a substrate; forming a first film pattern having a wide width dimension above the processed film; forming a second film pattern covering a portion of the first film pattern and a third film pattern connected to the second film pattern together above the processed film, the third film pattern having a width dimension narrower than the first film pattern, and to be a line pattern of a line and space pattern; forming a fourth film conformally so as to cover a remaining portion of the first film pattern, the second film pattern, and the third film pattern; forming a film pattern by the fourth film on a side face of the first film pattern and a plurality of film patterns by the fourth film to be a line pattern of a line and space pattern on both side faces of the third film pattern, by etching the fourth film until a remaining portion surface of the first film pattern, a surface of the second film pattern, and a surface of the third film pattern are exposed; removing the second film pattern and the third film pattern; and etching the processed film by using the plurality of film patterns by the fourth film formed on the both side faces of the third film pattern and a wide pattern formed by combining the first film pattern and the film pattern by the fourth film formed on the side face of the first film pattern as masks.

The first embodiment will be described below using the drawings.

Figure 1:
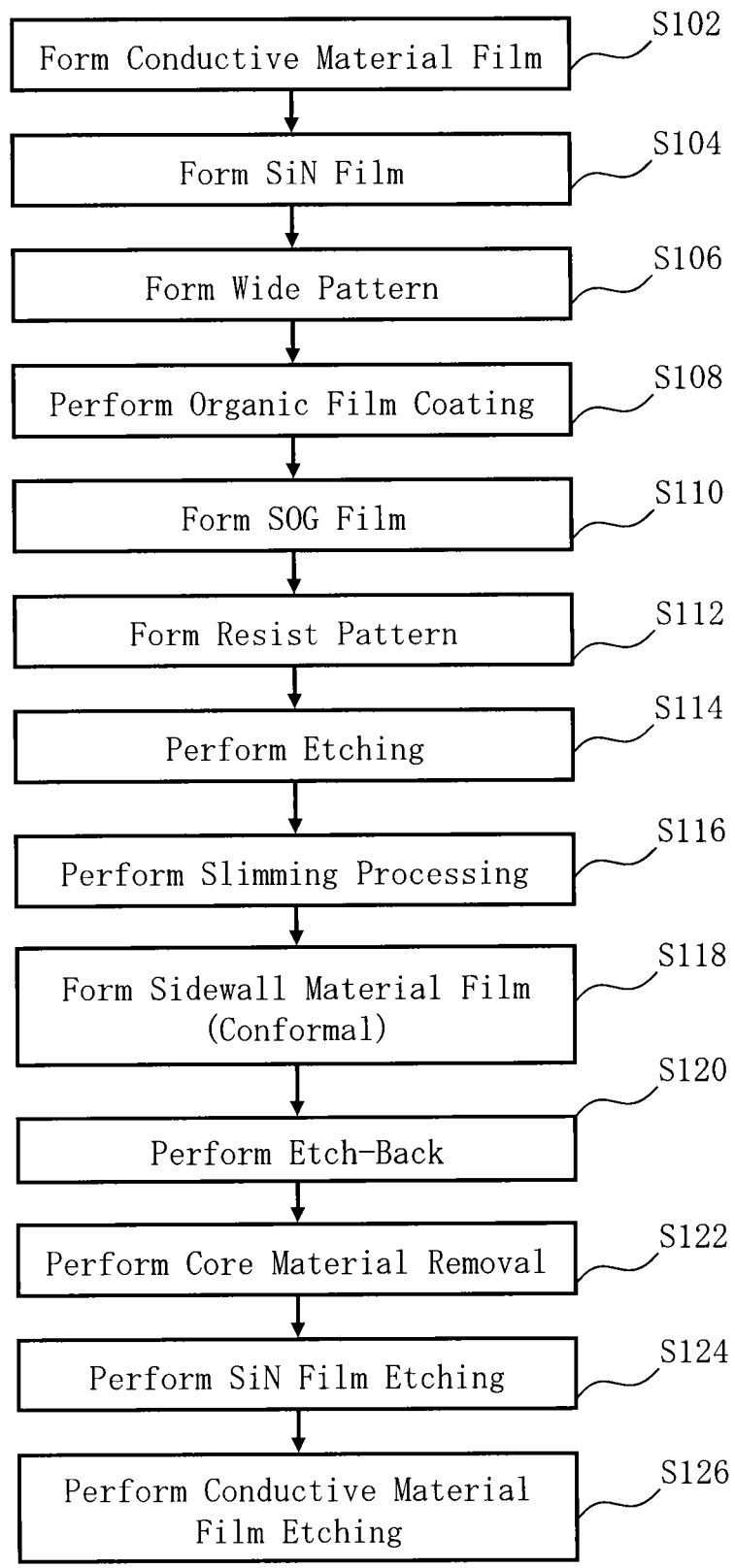
FIG. 1 is a flowchart showing principal part processes of a method for fabricating a semiconductor device according to a first embodiment.

FIG. 1 is a flowchart showing principal part processes of a method for fabricating a semiconductor device according to a first embodiment. In FIG. 1, the method for fabricating a semiconductor device according to the first embodiment executes a series of processes including a conductive material film formation process (S102), a silicon nitride (SiN) film formation process (S104), a wide pattern formation process (S106), an organic film coating process (S108), a Spin on Glass (SOG) film formation process (S110), a resist pattern formation process (S112), an etching process (S114), a slimming process (S116), a sidewall material film formation process (S118), an etch-back process (S120), a core material removal process (S122), a SiN film etching process (S124), and a conductive material film etching process (S126).

Figure 2A:
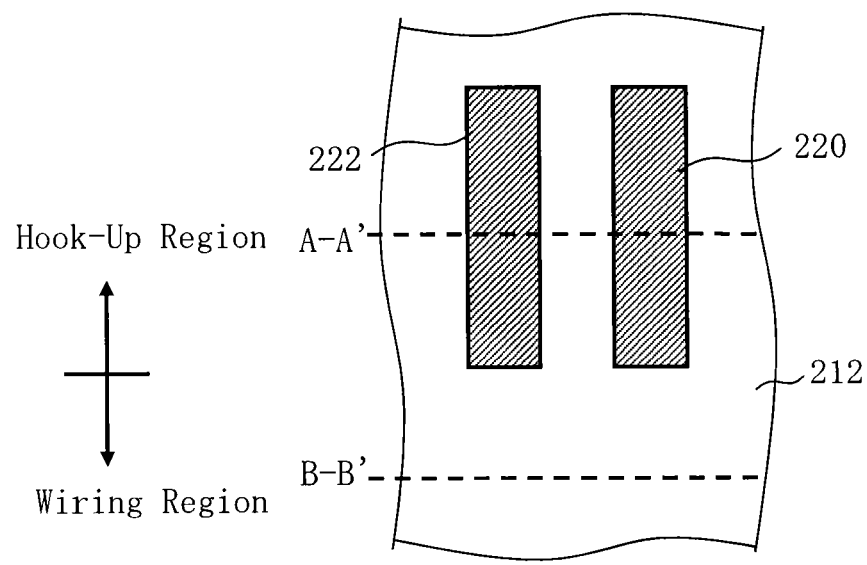
FIGS. 2A to 2C are a process top view and process sectional views of the method for fabricating a semiconductor device according to the first embodiment.
Figure 2B:
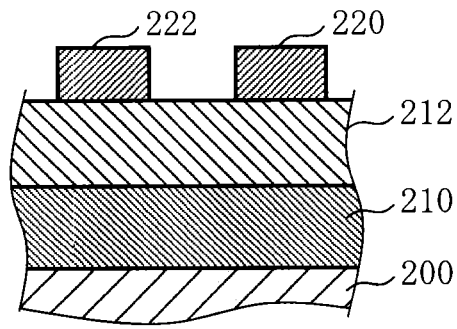
Figure 2C:
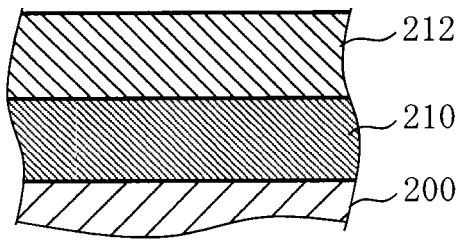

FIGS. 2A to 2C show a process top view and process sectional views of the method for fabricating a semiconductor device according to the first embodiment. FIGS. 2A to 2C show the conductive material film formation process (S102) to the wide pattern formation process (S106). Subsequent processes will be described later.

FIG. 2A shows a top view. FIG. 2B shows a process sectional view of a hook-up region (first region) of a chip formed on a substrate corresponding to an A-A' section in FIG. 2A. FIG. 2C shows a process sectional view of a wiring region (second region) of the chip formed on the substrate corresponding to a B-B' section in FIG. 2A.

First, as the conductive material film formation process (S102), a conductive material film 210 is formed on a semiconductor substrate (an example of the substrate) by using the chemical vapor deposition (CVD) method to a thickness of, for example, 50 nm. A polysilicon film is suitably used as a material of the conductive material film 210 (conductive film). In addition to polysilicon, a conductive material that can be etched is suitably used as a material of the conductive material film 210. For example, a silicon wafer of 300 mm in diameter is used as the semiconductor substrate 200. Agate dielectric film, interpoly dielectric film or the like to form a device portion may be formed on the semiconductor substrate 200. Alternatively, a layer having various semiconductor elements or structures (not shown) such as a device portion, contact plug layer, and other metal wires may be formed. Alternatively, other layers may be formed.

Then, as the SiN film formation process (S104), a silicon nitride (SiN) film 212 is formed on the conductive material film 210 by using the CVD method or the like to a thickness of, for example, 50 nm. The SiN film 212 is used as a hard mask material when the conductive material film 210 is etched. In the method for forming a pattern in the first embodiment, the SiN film 212 becomes an example of a processed film to form a pattern of a hard mask.

Next, as the wide pattern formation process (S106), a plurality of film patterns 220, 222 (first film patterns or first convex patterns) is formed on the SiN film 212 in a line width and pitch wider than a pattern to form a wire in the wiring region. Here, for example, an amorphous silicon (a-Si) film is first formed on the SiN film 212 by using the CVD method or the like. Then, as shown in FIGS. 2A and 2B, the film patterns 220, 222 (wide patterns) of an a-Si film are formed in the hook-up region in a line width and pitch sufficiently wider than a line & space pattern formed in the wiring region. In this stage, as shown in FIG. 2C, no pattern to form a wire is formed in the wiring region. In the first embodiment, a film pattern (first film pattern) wider than the wire width is formed before a pattern to form a wire in the wiring region is formed by the sidewall process.

Figure 3A:
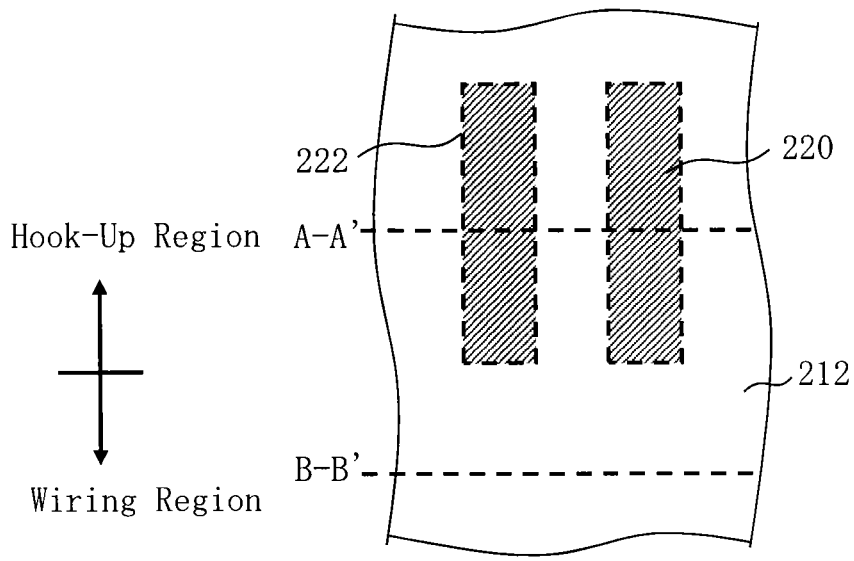
FIGS. 3A to 3C are a process top view and process sectional views of the method for fabricating a semiconductor device according to the first embodiment.
Figure 3B:
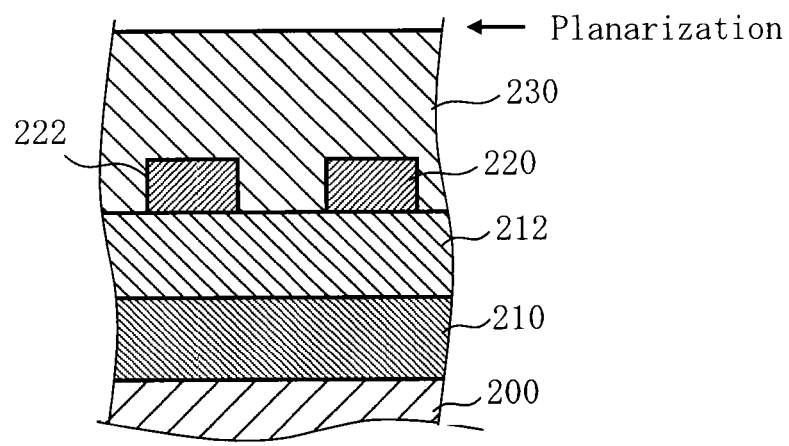
Figure 3C:
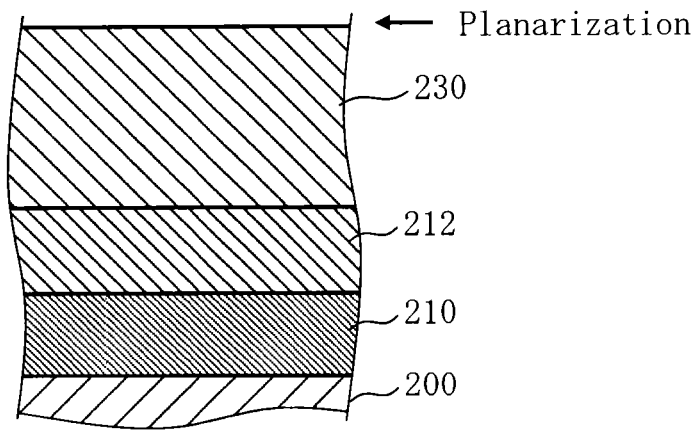

FIGS. 3A to 3C show a process top view and process sectional views of the method for fabricating a semiconductor device according to the first embodiment. FIGS. 3A to 3C show the organic film coating process (S108) in FIG. 1. Subsequent processes will be described later.

FIG. 3A shows a top view. FIG. 3B shows a process sectional view of the hook-up region of the chip formed on the substrate corresponding to an A-A' section in FIG. 3A. FIG. 3C shows a process sectional view of the wiring region of the chip formed on the substrate corresponding to a B-B' section in FIG. 3A.

In FIGS. 3A to 3C, as the organic film coating process (S108), after the first film patterns being formed, the whole substrate 200 is coated with an organic film 230 (coated organic film) to form the organic film 230 like covering the film patterns 220, 222 of the a-Si film. The surface of the substrate 200 is planarized by coating of the organic film 230. After the coating, a crosslinking reaction may be caused by, for example, baking at 300° C.

Figure 4A:
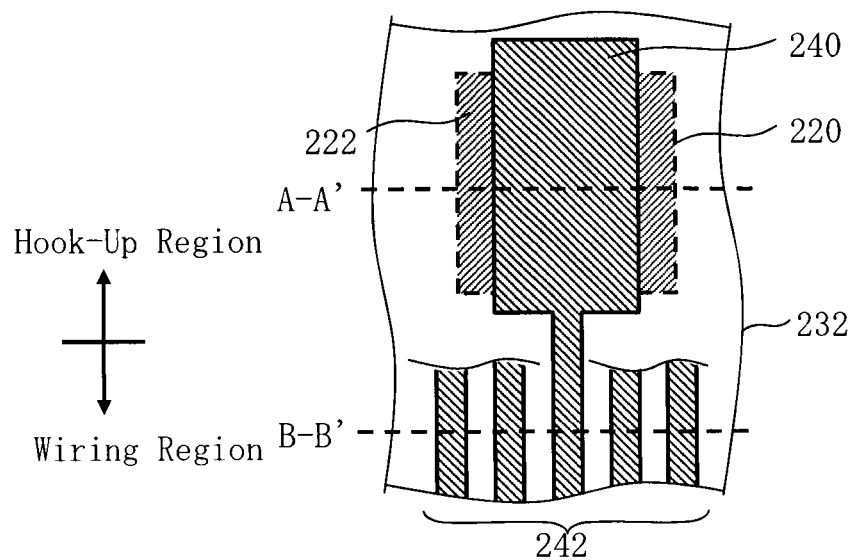
FIGS. 4A to 4C are a process top view and process sectional views of the method for fabricating a semiconductor device according to the first embodiment.
Figure 4B:
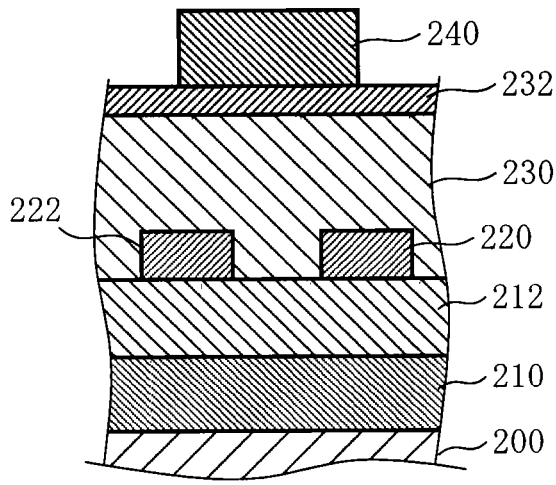
Figure 4C:
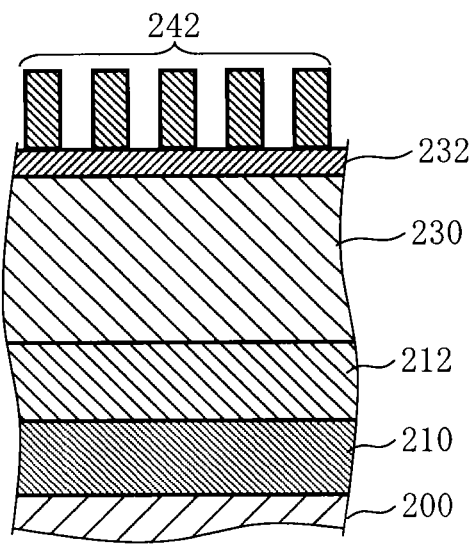

FIGS. 4A to 4C show a process top view and process sectional views of the method for fabricating a semiconductor device according to the first embodiment. FIGS. 4A to 4C show the SOG film formation process (S110) and the resist pattern formation process (S112) in FIG. 1. Subsequent processes will be described later.

FIG. 4A shows a top view. FIG. 4B shows a process sectional view of the hook-up region of the chip formed on the substrate corresponding to an A-A' section in FIG. 4A. FIG. 4C shows a process sectional view of the wiring region of the chip formed on the substrate corresponding to a B-B' section in FIG. 4A.

In FIGS. 4A to 4C, as the SOG film formation process (S110), a Spin on Glass (SOG) film 232 is first formed on the organic film 230 by using the coating process to a thickness of, for example, 30 nm.

Next, as the resist pattern formation process (S112), the whole surface of the substrate 200 is first coated with a resist. Then, a wide pattern is exposed in the hook-up region so as to extend over the two film patterns 220, 222 of the a-Si film by using lithography technology. In the wiring region, a 1:1 line & space pattern is exposed. Then, a resist pattern 240 extending over the two film patterns 220, 222 of the a-Si film is formed in the hook-up region and a resist pattern 242 to be a 1:1 line & space pattern is formed in the wiring region. At this point, as shown in FIGS. 4A and 4B, the resist pattern 240 is formed so as not to cover the side face of the film pattern 220 of the a-Si film on the side opposite to the arrangement direction of the film pattern 222 of the a-Si film. Similarly, the resist pattern 240 is formed so as not to cover the side face of the film pattern 222 of the a-Si film on the side opposite to the arrangement direction of the film pattern 220 of the a-Si film. The resist pattern 240 is formed so as to overlap with each of the film patterns 220, 222 of the a-Si film in an overlapping width larger than half the line width of the resist pattern 242. The resist pattern 242 shown in FIGS. 4A and 4C is suitably formed in a line width so that half the line width is less than the resolution limit of exposure. Moreover, as shown in FIG. 4A, the resist pattern 242 is formed so that at least one of convex line patterns constituting the resist pattern 242 formed in the wiring region is connected to the resist pattern 240 formed in the hook-up region. In the example in FIG. 4A, a center line pattern is connected to the resist pattern 240. Convex line patterns constituting the resist pattern 242 other than the center line pattern are each connected to corresponding wide resist patterns (not shown) by, for example, changing orientation 90 degrees before the resist pattern 240. Because the substrate surface has been planarized by the organic film coating process (S108), the resist patterns 240, 242 can be formed with high precision.

Figure 5A:
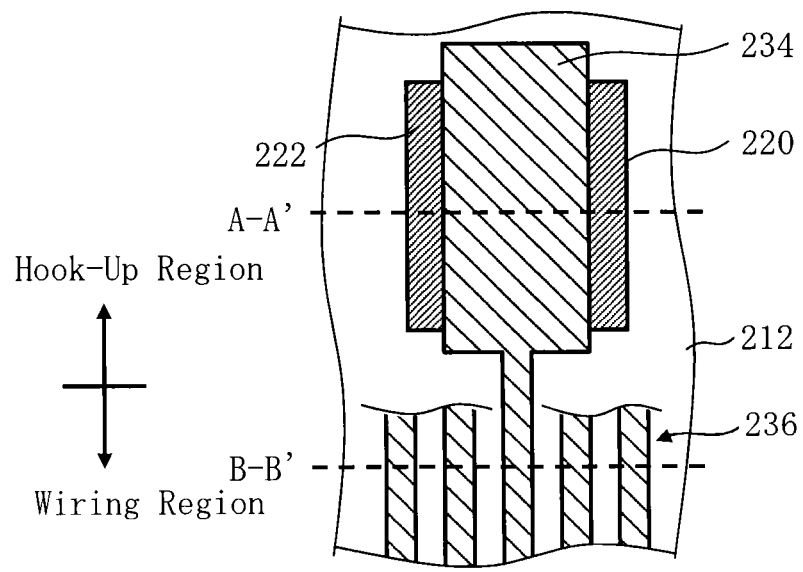
FIGS. 5A to 5C are a process top view and process sectional views of the method for fabricating a semiconductor device according to the first embodiment.
Figure 5B:
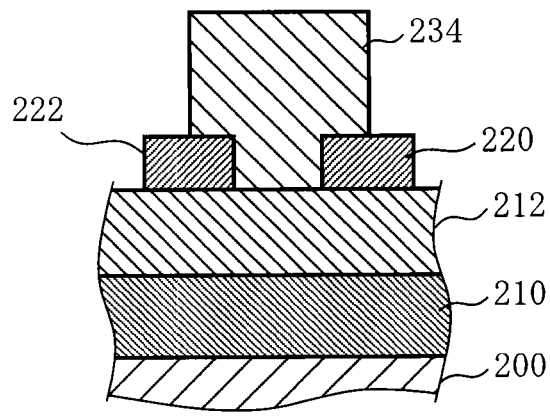
Figure 5C:
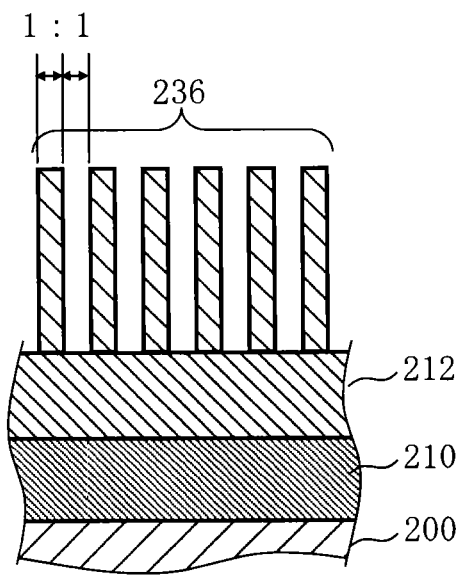

FIGS. 5A to 5C show a process top view and process sectional views of the method for fabricating a semiconductor device according to the first embodiment. FIGS. 5A to 5C show the etching process (S114) in FIG. 1. Subsequent processes will be described later.

FIG. 5A shows a top view. FIG. 5B shows a process sectional view of the hook-up region of the chip formed on the substrate corresponding to an A-A' section in FIG. 5A. FIG. 5C shows a process sectional view of the wiring region of the chip formed on the substrate corresponding to a B-B' section in FIG. 5A.

In FIGS. 5A to 5C, as the etching process (S114), the SOG film 232 is first etched by using the resist patterns 240, 242 as masks. Next, the organic film 230 is etched by using the etched SOG film 232 as a mask. A film pattern 234 of the organic film 230 covering portions of the film patterns 220, 222 of the a-Si film is formed, as shown in FIG. 5B, on the SiN film 212 (processed film) by the etching. Also, as shown in FIGS. 5A and 5C, a film pattern 236 of the organic film 230 connected to the film pattern 234 of the organic film 230, having a narrower width dimension than the film pattern 220, 222 of the a-Si film, and becoming a line pattern of a line & space pattern is formed on the SiN film 212 (processed film). A plurality of the film patterns 236 of the organic film 230 arranged side by side is each connected to the corresponding wide film patterns of the organic film (not shown) by changing orientation to the outer side before the film pattern 234 of the organic film 230 in the center. Thus, sets each including the film pattern 234 of the organic film 230 extending over a pair of the film patterns 220, 222 of the a-Si film and the film pattern 236 of the organic film 230 connected to the film pattern 234 of the organic film 230 and to be a line pattern are formed. By forming such sets, two sets of combination of a wide pattern of the hook-up and a line pattern to be a wire can be formed by the sidewall processing process described later from each set. The film pattern 234 of the organic film 230 is formed so as to overlap with each of the film patterns 220, 222 of the a-Si film in an overlapping width larger than half the line width of the film pattern 236 as a line pattern.

Figure 6A:
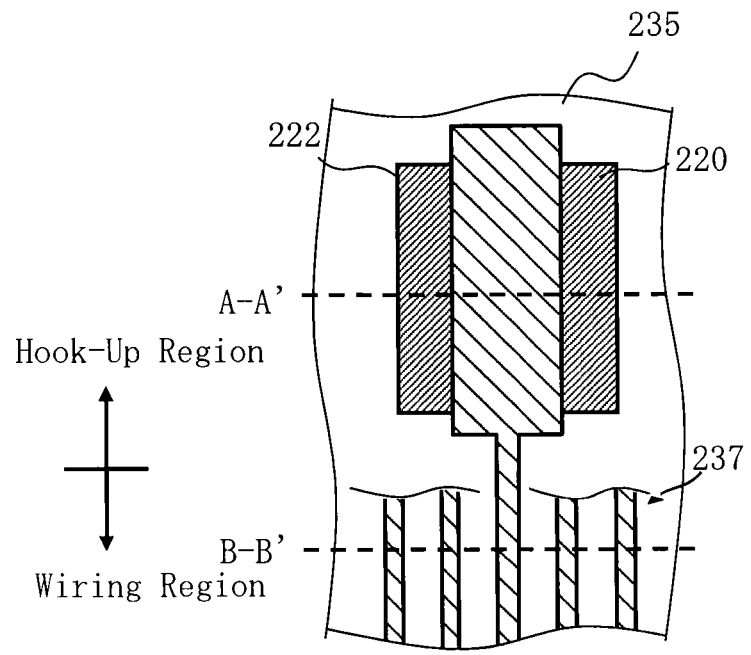
FIGS. 6A to 6C are a process top view and process sectional views of the method for fabricating a semiconductor device according to the first embodiment.
Figure 6B:
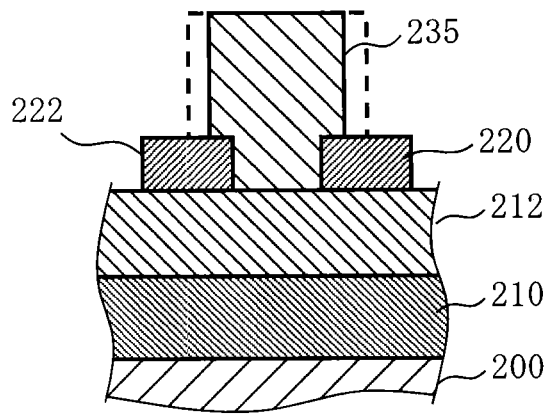
Figure 6C:
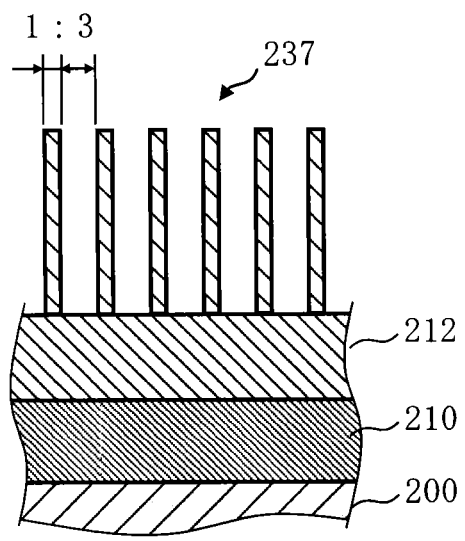

FIGS. 6A to 6C show a process top view and process sectional views of the method for fabricating a semiconductor device according to the first embodiment. FIGS. 6A to 6C show the slimming process (S116) in FIG. 1. Subsequent processes will be described later.

FIG. 6A shows a top view. FIG. 6B shows a process sectional view of the hook-up region of the chip formed on the substrate corresponding to an A-A' section in FIG. 6A. FIG. 6C shows a process sectional view of the wiring region of the chip formed on the substrate corresponding to a B-B' section in FIG. 6A.

In FIGS. 6A to 6C, as the slimming process (S116), slimming processing of the film pattern 234 of the organic film 230 and the plurality of film patterns 236 of the organic film 230 is performed. Slimming processing is performed so that, for example, the line width dimension of the plurality of film patterns 236 of the organic film 230 to be a line pattern of a line & space pattern is halved. At this point, the line width of the film pattern 234 of the organic film 230 is also slimmed by a width corresponding to half the line width dimension of the film pattern 236. By the slimming processing, as shown in FIGS. 6A and 6C, a plurality of film patterns 237 (third film pattern) of the organic film 230 to be a 1:3 line & space pattern can be formed in the wiring region. Also by the slimming processing, as shown in FIGS. 6A and 6B, a film pattern 235 (second film pattern) extending over the film patterns 220, 222 of the a-Si film can be formed in the hook-up region. The film pattern 234 of the organic film 230 before the slimming processing is formed so as to overlap with each of the film patterns 220, 222 of the a-Si film in an overlapping width larger than half the line width of the plurality of film patterns 236 and thus, the two film patterns 220, 222 of the a-Si film to be a pair can be prevented from opening a gap therebetween also after the slimming processing. In other words, the film 235 can be formed between the two film patterns 220, 222 of the a-Si film to be a pair so that the SiN film 212 is not exposed.

Figure 7A:
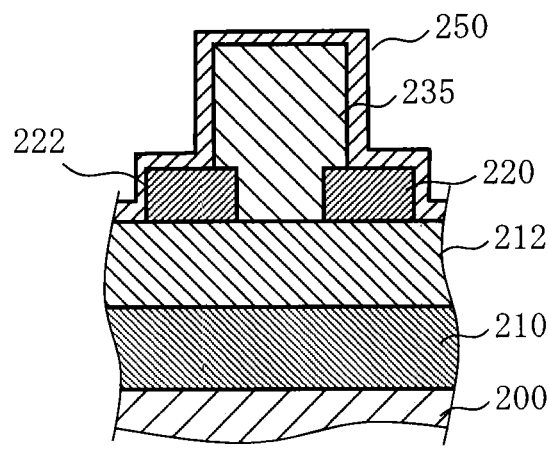
FIGS. 7A and 7B are process sectional views of the method for fabricating a semiconductor device according to the first embodiment.
Figure 7B:
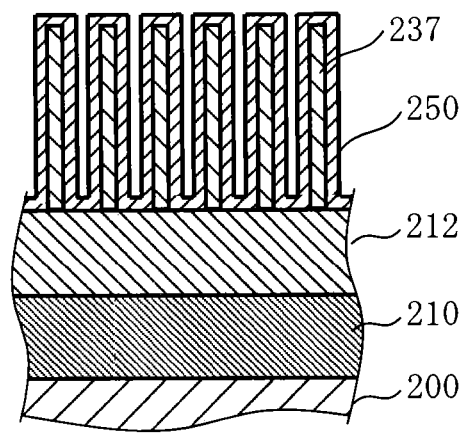

FIGS. 7A and 7B show process sectional views of the method for fabricating a semiconductor device according to the first embodiment. FIGS. 7A and 7B show the sidewall material film formation process (S118) in FIG. 1. Subsequent processes will be described later.

FIG. 7A shows a process sectional view of a hook-up region of the chip formed on the substrate. FIG. 7B shows a process sectional view of a wiring region of the chip formed on the substrate.

In FIGS. 7A and 7B, as the sidewall material film formation process (S118), a sidewall material film 250 (fourth film) is conformally formed on the substrate so as to cover remaining portions of the film patterns 220, 222 of the a-Si film that are not covered with the film pattern 235 of the organic film 230, the film pattern 235 of the organic film 230, and the plurality of film patterns 237 of the organic film 230 after the slimming processing. A silicon oxide film ($SiO_2$ film) is suitably used as the sidewall material film 250. The plasma CVD method can suitably be used as the formation method because the sidewall material film 250 can be formed at ordinary temperature or low temperature near the ordinary temperature and the organic film 230 can be prevented from melting.

Figure 8A:
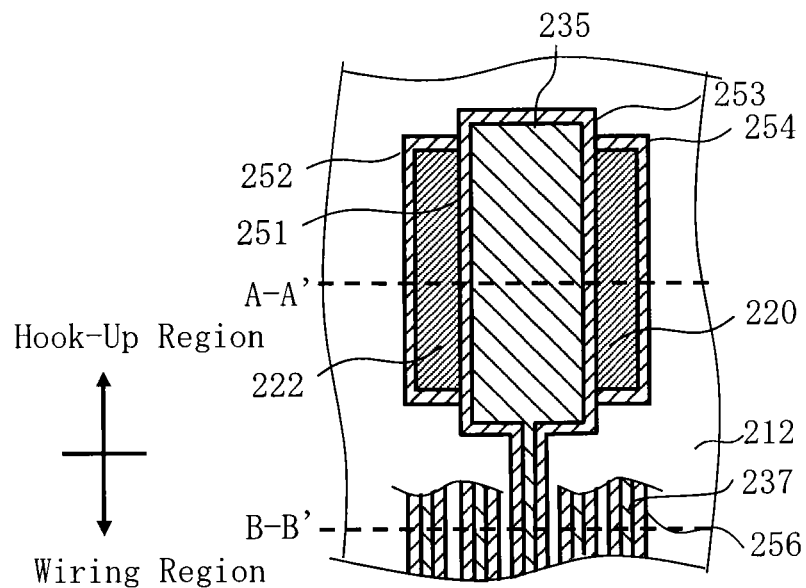
FIGS. 8A to 8C are a process top view and process sectional views of the method for fabricating a semiconductor device according to the first embodiment.
Figure 8B:
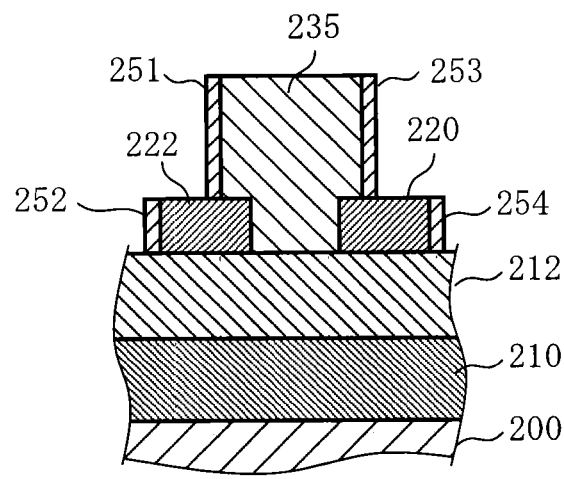
Figure 8C:
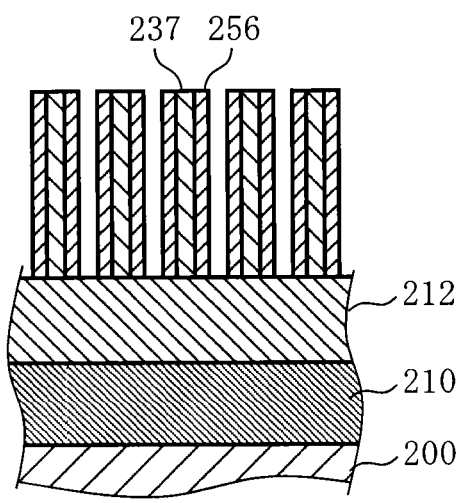

FIGS. 8A to 8C show a process top view and process sectional views of the method for fabricating a semiconductor device according to the first embodiment. FIGS. 8A to 8C show the etch-back process (S120) in FIG. 1. Subsequent processes will be described later.

FIG. 8A shows a top view. FIG. 8B shows a process sectional view of the hook-up region of the chip formed on the substrate corresponding to an A-A' section in FIG. 8A. FIG. 8C shows a process sectional view of the wiring region of the chip formed on the substrate corresponding to a B-B' section in FIG. 8A.

In FIG. 8A to 8C, as the etch-back process (S120), the sidewall material film 250 is etched until the surface of remaining portions of the film patterns 220, 222 of the a-Si film that are not covered with the film pattern 235 of the organic film 230, the surface of the film pattern 235 of the organic film 230, and the surface of the plurality of film patterns 237 of the organic film 230 are exposed. Accordingly, as shown in FIGS. 8A and 8B, a film pattern 254 by the sidewall material film 250 (film pattern of the fourth film) is formed on the side face (outer side face) that is not covered with the film pattern 235 of the organic film 230 of both side faces of the film pattern 220 of the a-Si film. At the same time, a film pattern 252 by the sidewall material film 250 (film pattern of the fourth film) is formed on the side face (outer side face) that is not covered with the film pattern 235 of the organic film 230 of both side faces of the film pattern 222 of the a-Si film. At the same time, film patterns 251, 253 by the sidewall material film 250 are formed on both sidewalls of the film pattern 235 of the organic film 230. Further, as shown in FIGS. 8A and 8C, a plurality of film patterns 256 by the sidewall material film 250 (film pattern of the fourth film) in a line width less than the resolution limit of exposure is formed on both side faces of the plurality of film patterns 237 of the organic film 230. The film pattern 256 by the sidewall material film 250 is formed on both side faces of each of the plurality of film patterns 237 of the organic film 230. The film pattern 235 of the organic film 230 and the film patterns 237 of the organic film 230 connected thereto have, as shown in FIG. 8A, film patterns 251, 253, 256 by the sidewall material film 250 formed so as to surround the side faces of the film pattern 235 and the film pattern 237.

Figure 9A:
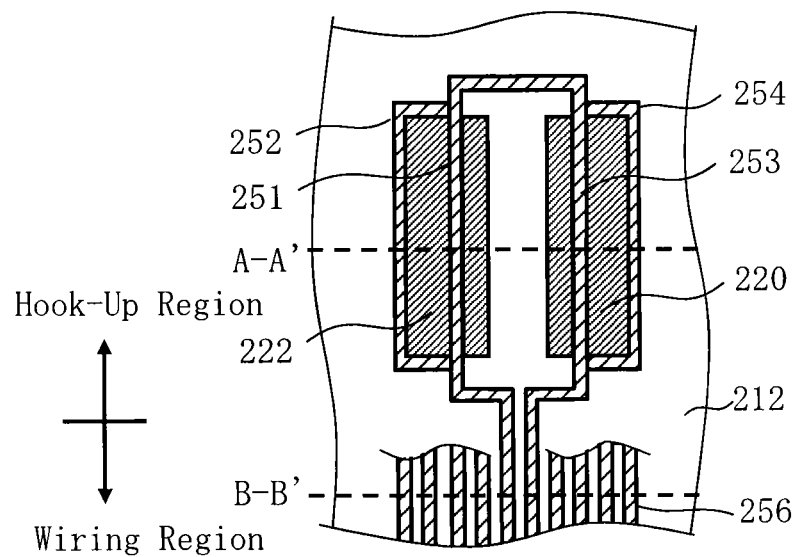
FIGS. 9A to 9C are a process top view and process sectional views of the method for fabricating a semiconductor device according to the first embodiment.
Figure 9B:
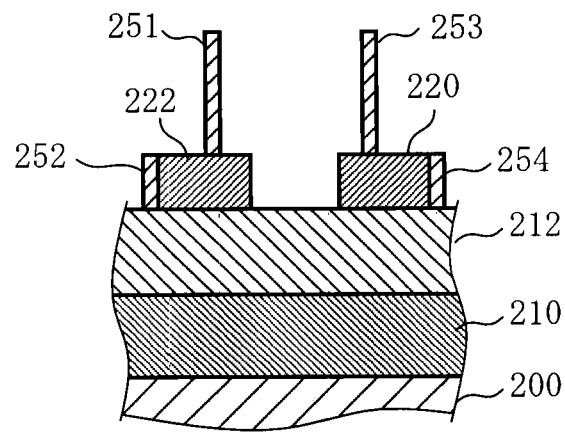
Figure 9C:
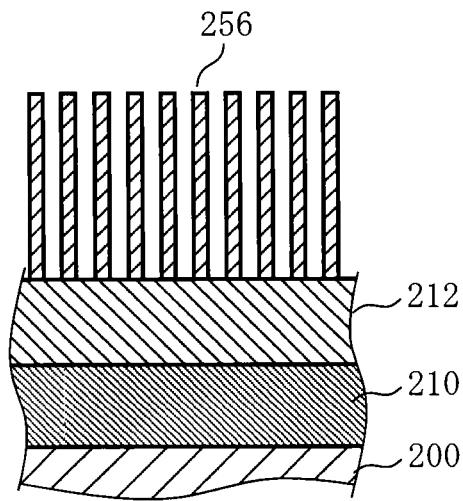

FIGS. 9A to 9C show a process top view and process sectional views of the method for fabricating a semiconductor device according to the first embodiment. FIGS. 9A to 9C show the core material removal process (S122) in FIG. 1. Subsequent processes will be described later.

FIG. 9A shows a top view. FIG. 9B shows a process sectional view of the hook-up region of the chip formed on the substrate corresponding to an A-A' section in FIG. 9A. FIG. 9C shows a process sectional view of the wiring region of the chip formed on the substrate corresponding to a B-B' section in FIG. 9A.

In FIGS. 9A to 9C, as the core material removal process (S122), the film pattern 235 of the organic film 230 and the plurality of film patterns 237 of the organic film 230 to be a core material are removed by the dry ashing method. Accordingly, as shown in FIGS. 9A and 9B, the film pattern 220 of the a-Si film and the film pattern 254 by the sidewall material film 250 in contact with one sidewall (outer sidewall) of the film pattern 220 of the a-Si film can be left. At the same time, the film pattern 222 of the a-Si film and the film pattern 252 by the sidewall material film 250 in contact with one sidewall (outer sidewall) of the film pattern 222 of the a-Si film can be left. According to the above technique, a wide pattern (first wide pattern) wider than the film pattern 220 of the a-Si film in width can be formed by combining the film pattern 220 of the a-Si film and the film pattern 254 by the sidewall material film 250. Similarly, a wide pattern (second wide pattern) wider than the film pattern 222 of the a-Si film in width can be formed by combining the film pattern 222 of the a-Si film and the film pattern 252 by the sidewall material film 250. In the wiring region, on the other hand, as shown in FIGS. 9A and 9C, the plurality of film patterns 256 by the sidewall material film 250 to be a line pattern of a 1:1 line & space pattern that secures a sufficient thickness (height) to process a lower-layer film can be formed.

From the above, according to the first embodiment, the two film patterns 220, 222 (first convex patterns) of the a-Si film having a wide width dimension and to be a pair can be formed side by side in a position of the hook-up (hook-up region) on the substrate. Then, the film patterns 252, 254 (second convex patterns) by the sidewall material film 250 can be formed on the outer side face of the two film patterns 220, 222 of the a-Si film respectively. Accordingly, a wide pattern (first wide pattern) by combining the film pattern 220 of the a-Si film and the film pattern 254 by the sidewall material film 250 formed on the sidewall of the film pattern 220 can be formed in the hook-up region. Similarly, a wide pattern (second wide pattern) by combining the film pattern 222 of the a-Si film and the film pattern 252 by the sidewall material film 250 formed on the sidewall of the film pattern 222 can be formed. At the same time, the film pattern 256 (third convex pattern) by the sidewall material film 250 connected to the wide pattern by combining the film pattern 220 of the a-Si film and the film pattern 254 by the sidewall material film 250 and to be a line pattern of a line & space pattern can be formed in the wiring position (wiring region) on the substrate. Similarly, the film pattern 256 (third convex pattern) by the sidewall material film 250 connected to the wide pattern by combining the film pattern 222 of the a-Si film and the film pattern 252 by the sidewall material film 250 and to be a line pattern of a line & space pattern can be formed. Thus, the corresponding one of two adjacent line patterns of line & space patterns is connected to each of the two wide patterns to be a pair.

As shown in FIG. 9A, the two film patterns 252, 254 by the sidewall material film 250 and the two film patterns 256 by the sidewall material film 250 to be two adjacent line patterns of line & space patterns, each of which connected to the corresponding one of the film patterns 252, 254, can be formed in substantially the same line width less than the resolution limit of exposure.

According to the first embodiment, as described above, the film pattern 235 of the organic film 230 is formed between the two aligned film patterns 220, 222 of the a-Si film to be a pair so as to extend over the two aligned film patterns 220, 222 of the a-Si film. Then, the film pattern 237 of the organic film 230 to be one line pattern of line & space pattern connected to the film pattern 235 of the organic film 230 is formed. Then, by performing the sidewall processing using the organic film 230 as a core material, a pair of adjacent wide patterns and a pair of adjacent line patterns of line & space patterns, each of which connected to the corresponding wide pattern, can be formed. Thus, according to the first embodiment, a set of connected wide patterns is formed for each pair of adjacent line patterns.

Figure 10A:
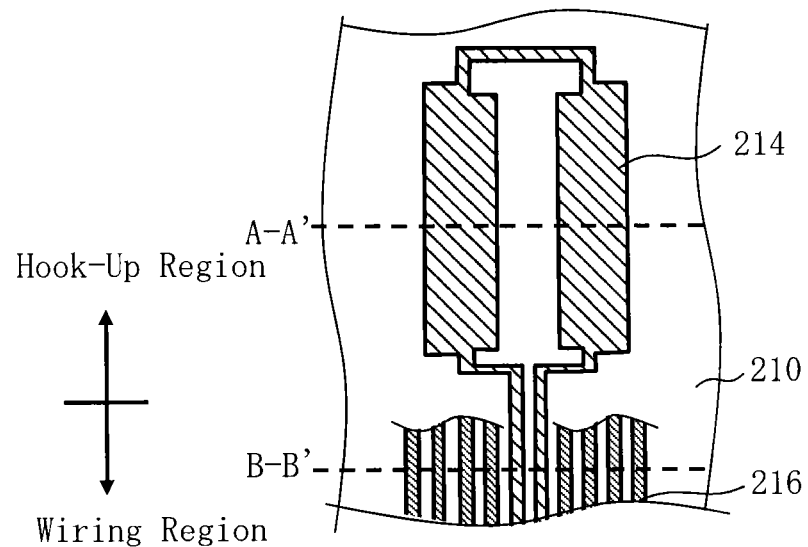
FIGS. 10A to 10C are a process top view and process sectional views of the method for fabricating a semiconductor device according to the first embodiment.
Figure 10B:
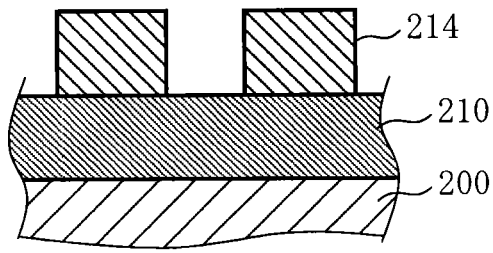
Figure 10C:
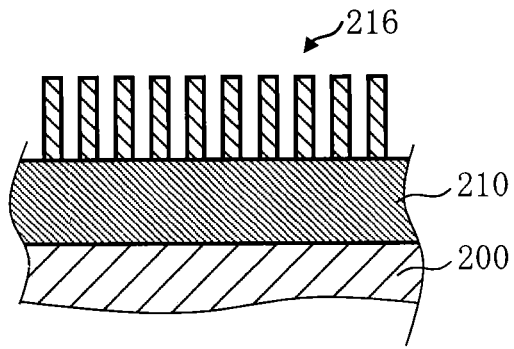

FIGS. 10A to 10C show a process top view and process sectional views of the method for fabricating a semiconductor device according to the first embodiment. FIGS. 10A to 10C show the SiN film etching process (S124). Subsequent processes will be described later.

FIG. 10A shows a top view. FIG. 10B shows a process sectional view of the hook-up region of the chip formed on the substrate corresponding to an A-A' section in FIG. 10A. FIG. 10C shows a process sectional view of the wiring region of the chip formed on the substrate corresponding to a B-B' section in FIG. 10A.

In FIGS. 10A to 10C, as the SiN film etching process (S124), the SiN film 212 is etched by using the plurality of film patterns 256 (third convex patterns) by the sidewall material film 250 formed by etching the sidewall material film 250 and to be a line pattern, a wide pattern combining the film pattern 254 (second convex pattern) by the sidewall material film 250 and the film pattern 220 of the a-Si film, and a wide pattern combining the film pattern 252 (second convex pattern) by the sidewall material film 250 and the film pattern 222 of the a-Si film as masks. Accordingly, as shown in FIGS. 10A and 10B, a wide pair of film patterns 214 by the SiN film 212 having substantially the same width dimension as a pair of wide patterns combining the film patterns 220, 222 of the a-Si film and the film patterns 254, 256 by the sidewall material film 250 can be formed in the hook-up region. At the same time, as shown in FIGS. 10A and 10C, a plurality of film patterns 216 by the SiN film 212 to be a line pattern of a 1:1 line & space pattern can be formed in the wiring region.

According to the first embodiment, as described above, a 1:1 line & space pattern in dimensions less than the resolution limit of exposure can be formed at the same time while forming a pair of wide patterns.

Figure 11A:
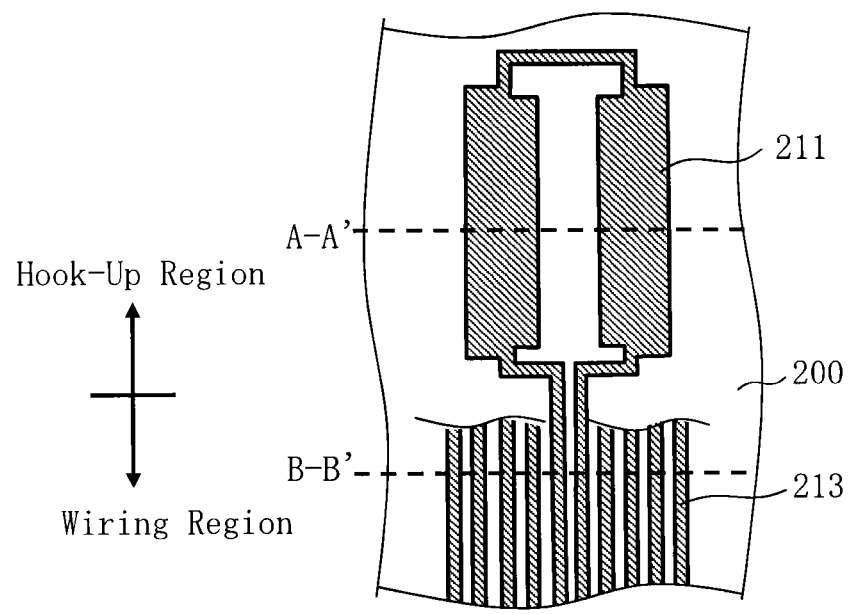
FIGS. 11A to 11C are a process top view and process sectional views of the method for fabricating a semiconductor device according to the first embodiment.
Figure 11B:
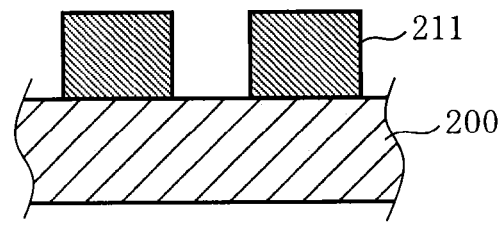
Figure 11C:
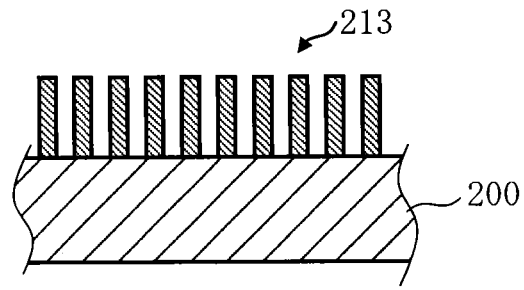

FIGS. 11A to 11C show a process top view and process sectional views of the method for fabricating a semiconductor device according to the first embodiment. FIGS. 11A to 11C show the conductive material film etching process (S126) in FIG. 1.

FIG. 11A shows a top view. FIG. 11B shows a process sectional view of the hook-up region of the chip formed on the substrate corresponding to an A-A' section in FIG. 11A. FIG. 11C shows a process sectional view of the wiring region of the chip formed on the substrate corresponding to a B-B' section in FIG. 11A.

In FIGS. 11A to 11C, as the conductive material film etching process (S126), after the SiN film 212 being etched, the conductive material film 210 is etched by using the film pattern 214 of the remaining SiN film 212 as a mask. Accordingly, a pair of wide patterns are transferred to the conductive material film 210 in the hook-up region so that, as shown in FIGS. 11A and 11B, the film pattern 211 of the wide conductive material film 210 can be formed. At the same time, a sidewall pattern by sidewall processing is transferred to the conductive material film 210 in the wiring region so that, as shown in FIGS. 11A and 11C, a plurality of film patterns 213 by the conductive material film 210 to be a line pattern of a 1:1 line & space pattern can be formed.

Figure 12:
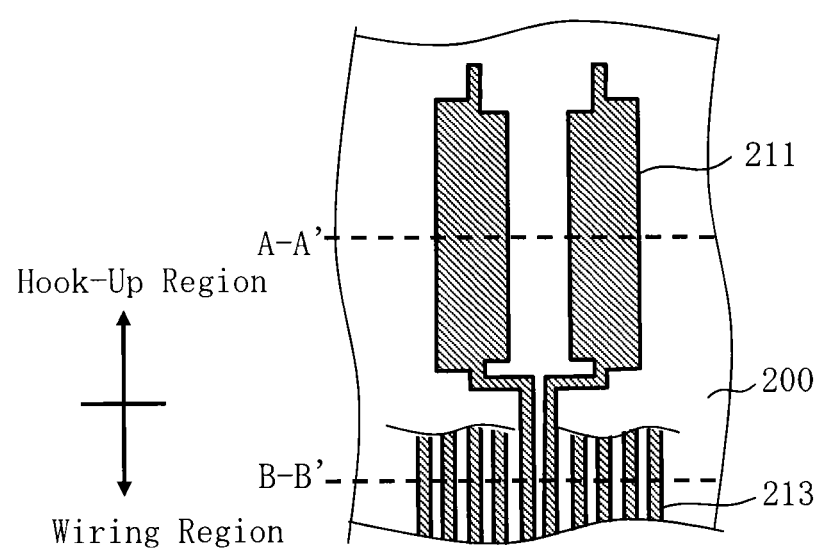
FIG. 12 is a top view exemplifying a wire formed by the method for fabricating a semiconductor device according to the first embodiment.

FIG. 12 is a top view exemplifying a wire formed by the method for fabricating a semiconductor device according to the first embodiment. As shown in FIG. 12, the plurality of film patterns 213 by the conductive material film 210 to be a line pattern of a 1:1 line & space pattern can be formed as wires by cutting off ends of the plurality of film patterns 213 by the conductive material film 210 that are connected adjacent to each other in the end. The one film pattern 213 can be connected to each of the two film patterns 211 to be paired of the wide conductive material film 210. Then, the film pattern 211 of the wide conductive material film 210 remaining after etching using as the next mask the remaining SiN film 212 remaining after etching using film patterns of the film patterns 252, 254 by the sidewall material film 250 formed on the side face of the film patterns 220, 222 of the a-Si film and the film patterns 220, 222 of the a-Si film as masks is used as a hook-up.

Figure 13A:
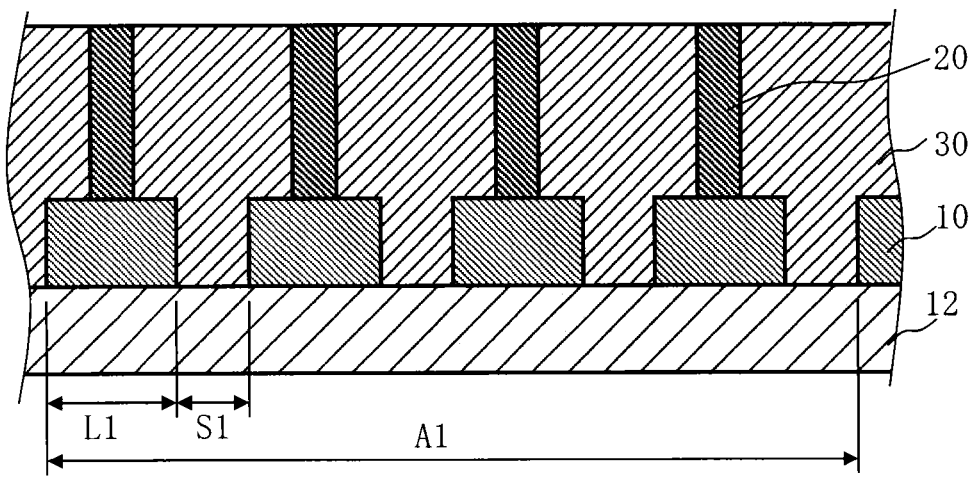
FIGS. 13A to 13C are conceptual diagrams illustrating conditions of a hook-up according to a comparative example of the first embodiment.
Figure 13B:
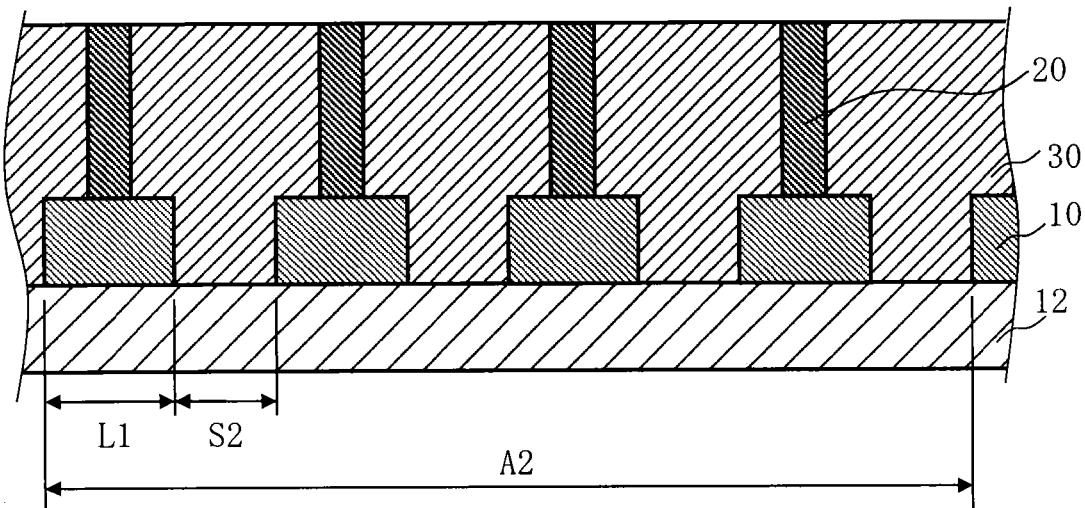
Figure 13C:
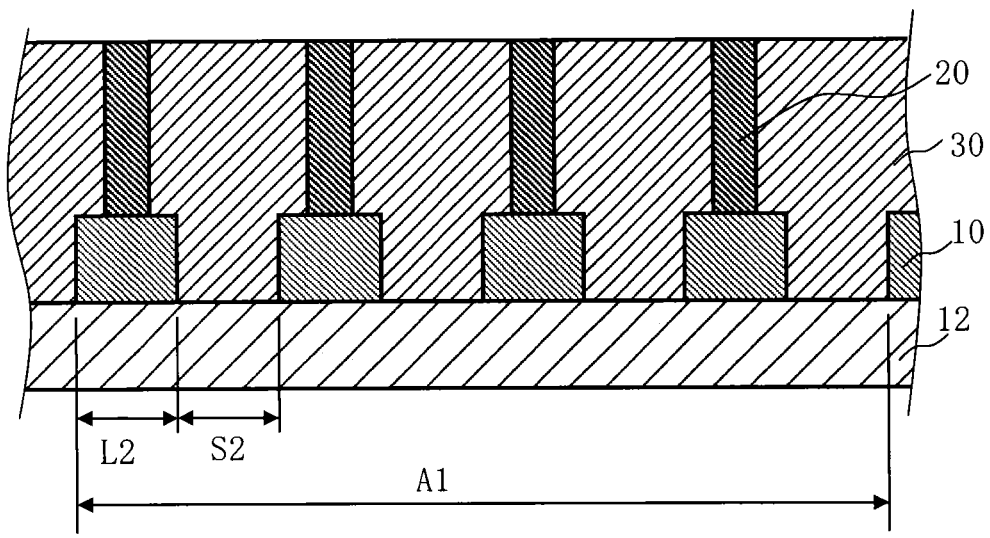

FIGS. 13A to 13C are conceptual diagrams illustrating conditions of a hook-up according to a comparative example of the first embodiment. FIG. 13A shows a case when a wide pattern of a hook-up 10 is formed as an L1:S1 (L1>S1) line & space pattern in an inter-level dielectric 30 on a substrate 12. Then, a contact 20 is connected to the hook-up 10. FIG. 13A also shows a case when the four hook-ups 10 are formed in a dimension A1. In the dimension configuration shown in FIG. 13A, the width 51 to be a space pattern becomes narrow and a problem of short when a pattern is formed by lithography could occur. If the wide pattern of the hook-up 10 is formed, as shown in FIG. 13B, as an L1:S2 (S2>S1) line & space pattern to avoid such a problem, this time a problem of an increased chip size from A1 to A2 occurs for an increase of the space pattern size. Conversely, if the wide pattern of the hook-up 10 is formed, as shown in FIG. 13C, as an L2: S2 (L2=S2) line & space pattern to maintain the chip size at A1, a problem of the shifted contact 20 could occur.

Figure 14A:
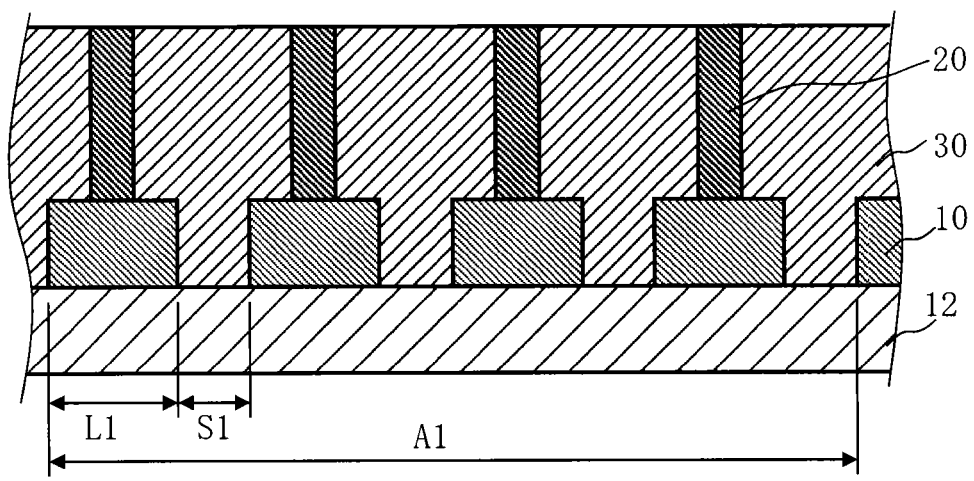
FIGS. 14A and 14B are conceptual diagrams illustrating conditions of the hook-up according to the first embodiment.
Figure 14B:
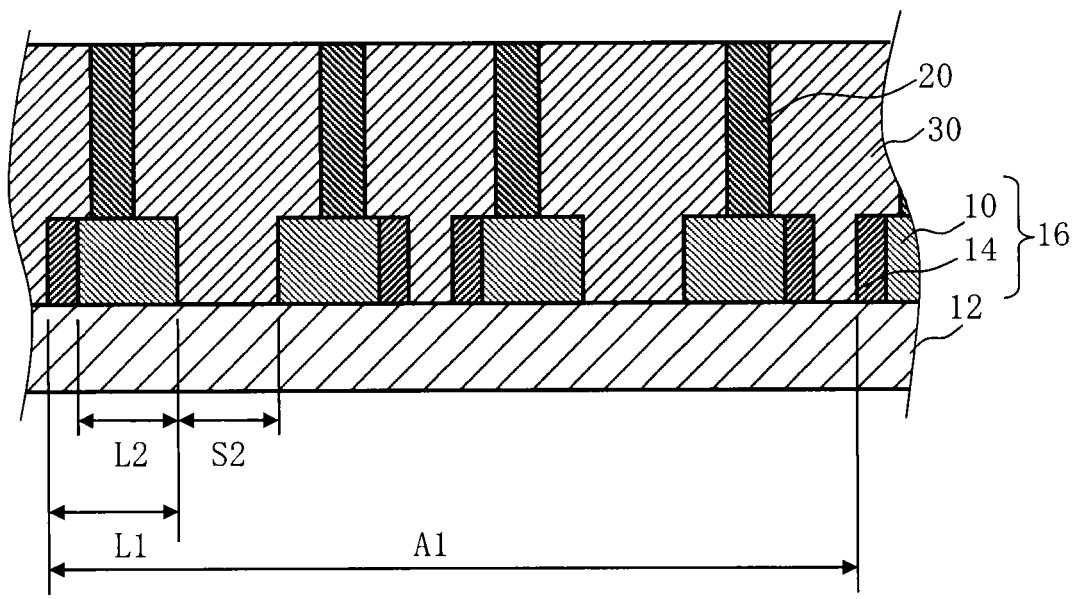

FIGS. 14A and 14B are conceptual diagrams illustrating conditions of the hook-up according to the first embodiment. FIG. 14A shows a case when, like FIG. 13A showing the above comparative example, a wide pattern of the hook-up 10 is formed as an L1:S1 (L1>S1) line & space pattern in the inter-level dielectric 30 on the substrate 12. Then, the contact 20 is connected to the hook-up 10. FIG. 14A also shows a case when the four hook-ups 10 are formed in the dimension A1. According to the first embodiment, by contrast, a sidewall pattern 14 can be added to one side face of the hook-up 10 and thus, even if the wide pattern of the hook-up 10 is formed, as shown in FIG. 14B, as the L2: S2 (L2=S2) line & space pattern to maintain the chip size at A1, a wide pattern 16 combining the hook-up 10 and the sidewall pattern 14 can be formed. Therefore, the shifted contact 20 can be avoided while maintaining the chip size at A1.

Figure 15:
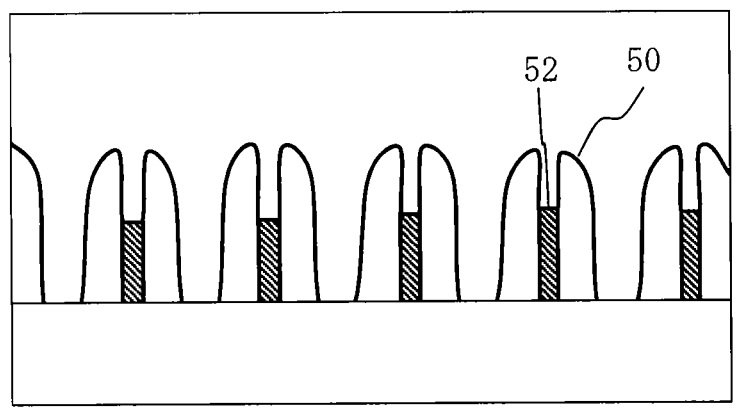
FIG. 15 is a conceptual diagram illustrating a resist residue of a sidewall pattern according to the comparative example of the first embodiment.

FIG. 15 is a conceptual diagram illustrating a resist residue of a sidewall pattern according to the comparative example of the first embodiment. The comparative example shows a case when, after a sidewall pattern 50 being formed in a width less than the resolution limit, the sidewall pattern 50 is coated with a resist to form, for example, a wide pattern in a region outside the wiring region by lithography technology. In such a case, as described above, exposure light does not reach a resist near a lower portion of the sidewall pattern 50 and the resist cannot be removed by development and thus, a resist residue 52 arises. However, according to the first embodiment, a wide pattern is already formed before a sidewall pattern in a width less than the resolution limit is formed and thus, such a problem as a resist residue between sidewall patterns does not arise. Also according to the first embodiment, a conventional problem of the collapse of sidewall patterns due to surface tension of water in a rinsing/drying process after the development can be avoided. Moreover, the occurrence of random air gaps generated by poor embedding generated by coating of a coating organic film between sidewall patterns after the sidewall patterns being formed can be avoided. Further, as described above, the thickness (height) of the sidewall pattern to process a lower-layer film can be secured.

In the foregoing, embodiments have been described with reference to concrete examples. However, the present disclosure is not limited to the concrete examples. According to the flow chart shown in FIG. 1, for example, the slimming process (S116) is performed after the etching process (S114), but slimming processing on the resist pattern 240, 242 shown in FIGS. 4A to 4C after the resist pattern formation process (S112) may be performed or slimming processing on the SOG film 232 to which the resist patterns 240, 242 have been transferred may be performed in the etching process (S114). Alternatively, slimming processing on the film patterns 234, 236 of the organic film 230 shown in FIGS. 6A to 6C and slimming processing on the resist patterns 240, 242 or the SOG film 232 may be combined.

In addition, all methods for forming a pattern, all semiconductor devices, and all methods for fabricating a semiconductor device that include elements of the present embodiment and whose design can be changed as appropriate by persons skilled in the art are included in the scope of the present disclosure.

While techniques normally used in the semiconductor industry such as cleaning before and after treatment are not described for convenience of description, it is needless to say that such techniques are included in the scope of the present disclosure.

While certain embodiments have been described, these embodiments have been presented by way of example only, and are not intended to limit the scope of the inventions. Indeed, the novel methods and devices described herein may be embodied in a variety of other forms; furthermore, various omissions, substitutions and changes in the form of the methods and devices described herein may be made without departing from the spirit of the inventions. The accompanying claims and their equivalents are intended to cover such forms or modifications as would fall within the scope and spirit of the inventions.

What is claimed is:

1. A method for forming a pattern, comprising:
    forming a processed film above a substrate;
    forming a first film pattern having a wide width dimension above the processed film;
    forming a second film pattern covering a portion of the first film pattern and a third film pattern connected to the second film pattern together above the processed film, the third film pattern having a width dimension narrower than the first film pattern, and to be a line pattern of a line and space pattern;
    forming a fourth film conformally so as to cover a remaining portion of the first film pattern, the second film pattern, and the third film pattern;
    forming a film pattern by the fourth film on a side face of the first film pattern and a plurality of film patterns by the fourth film to be a line pattern of a line and space pattern on both side faces of the third film pattern, by etching the fourth film until a remaining portion surface of the first film pattern, a surface of the second film pattern, and a surface of the third film pattern are exposed;
    removing the second film pattern and the third film pattern; and
    etching the processed film by using the plurality of film patterns by the fourth film formed on the both side faces of the third film pattern and a wide pattern formed by combining the first film pattern and the film pattern by the fourth film formed on the side face of the first film pattern as masks.

2. The method according to claim 1, wherein the second film pattern and the third film pattern are formed of a coated organic film.

3. The method according to claim 1, wherein a silicon oxide film (SiO$_2$ film) is used as the fourth film.

4. The method according to claim 1, wherein the film pattern by the fourth film having a line width less than a resolution limit of exposure is formed on the side face of the first film pattern by etching the fourth film.

5. The method according to claim 4, wherein a plurality of film patterns by the fourth film having the line width less than the resolution limit of exposure are formed on both side faces of the second film pattern by etching the fourth film.

6. The method according to claim 1, further comprising:
    forming a conductive film in a lower layer of the processed film; and
    etching the conductive film using a remaining processed film as a mask after the processed film being etched.

7. The method according to claim 1, wherein
    two first film patterns to be a pair are aligned and formed when the first pattern is formed,
    the second film pattern is formed by covering a portion of each of the two first film patterns respectively,
    a first wide pattern combining one of the two first film patterns and a film pattern by the fourth film formed on a side face of the one of the two first film patterns and a second wide pattern combining an another one of the two first film patterns and a film pattern by the fourth film formed on a side face of the another one of the two first film patterns are formed,
    a film pattern of the plurality of film patterns by the fourth film formed on an one side face of the third film pattern is connected to the first wide pattern using one of the two first film patterns, and
    a film pattern of the plurality of film patterns by the fourth film formed on an another side face of the third film pattern is connected to the second wide pattern using the another one of the two first film patterns.

8. The method according to claim 1, wherein the plurality of film patterns by the fourth film having a line width less than a resolution limit of exposure are formed on the both side faces of the third film pattern by etching the fourth film.

9. The method according to claim 6, wherein the conductive film remaining after etching using as a next mask the processed film remaining after etching using the film pattern by the fourth film formed on the side face of the first film pattern and the first film pattern as the masks, is used as a hook-up of a wire.

10. The method according to claim 9, wherein the conductive film remaining after etching using as the next mask the processed film remaining after the etching using the plurality of film patterns by the fourth film formed on the side face of the third film pattern as the mask, is used as a wire.

11. The method according to claim 10, wherein a silicon (Si) film is used as the conductive film.

12. The method according to claim 1, further comprising:
    forming a coated organic film so as to cover the first film pattern for planarization after the first film pattern being formed.

13. The method according to claim 12, wherein the second film pattern and the third film pattern are formed by processing the coated organic film.

14. A method for forming a pattern, comprising:
    forming two first convex patterns to be paired having a wide width dimension side by side in a first region above a substrate above which a conductive film is formed,
    forming second convex patterns on an outer side face of each of the two first convex patterns respectively and also two third convex patterns, each of which connected to one of the second convex patterns on the outer side face of the two first convex patterns, to be adjacent two line patterns of a line and space pattern in a second region above the substrate in a line width substantially a same width as the second convex patterns and narrower than a width dimension of the first convex patterns, and etching the conductive film in ways that allow the first, second, and third convex patterns to be transferred.

15. The method according to claim 14, wherein the second and third convex patterns are formed in the line width less than a resolution limit of exposure.

16. The method according to claim 14, wherein
the second region is a wiring region and
the line and space pattern of a wire is formed by etching the conductive film in ways that allow the third convex patterns to be transferred.

17. The method according to claim 16, wherein the first region is a hook-up region and a hook-up is formed by etching the conductive film in ways that allow a wide pattern combining each of the first convex patterns and one of the second convex patterns formed on the outer side face thereof to be transferred.

18. The method according to claim 14, further comprising: forming a coated organic film so as to cover the two first convex patterns for planarization after the two first convex patterns being formed.

19. The method according to claim 18, further comprising: forming a film pattern by the coated organic film in the first region so as to extend over the two first convex patterns.

20. The method according to claim 19, further comprising: forming a line pattern connected to the film pattern by the coated organic film in the second region, the third convex patterns being formed on both side faces of the line pattern by the coated organic film.

* * * * *